(12) United States Patent
 Palm

(10) Patent No.: US 10,692,803 B2
(45) Date of Patent: Jun. 23, 2020

(54) DIE EMBEDDING

(71) Applicant: Infineon Technologies Austria AG, Villach (AT)

(72) Inventor: Petteri Palm, Regensburg (DE)

(73) Assignee: Infineon Technologies Austria AG, Villach (AT)

(*) Notice: Subject to any disclaimer, the term of this patent is extended or adjusted under 35 U.S.C. 154(b) by 0 days.

(21) Appl. No.: 15/919,746

(22) Filed: Mar. 13, 2018

(65) Prior Publication Data

US 2018/0269146 A1    Sep. 20, 2018

(30) Foreign Application Priority Data

Mar. 14, 2017 (DE) .......................... 10 2017 105330

(51) Int. Cl.
*H01L 23/498* (2006.01)
*H01L 23/31* (2006.01)
(Continued)

(52) U.S. Cl.
CPC .... *H01L 23/49838* (2013.01); *H01L 21/4846* (2013.01); *H01L 21/52* (2013.01); *H01L 21/568* (2013.01); *H01L 23/16* (2013.01); *H01L 23/3121* (2013.01); *H01L 23/5389* (2013.01); *H01L 23/49827* (2013.01);
(Continued)

(58) Field of Classification Search
CPC ....... H01L 23/5389; H01L 2924/15153; H01L 23/5386; H01L 3/481; H01L 23/49827; H01L 23/5384
See application file for complete search history.

(56) References Cited

U.S. PATENT DOCUMENTS 5,296,736 A    3/1994   Frei et al.
6,506,632 B1 *   1/2003   Cheng ................... H01L 21/568
                                             257/E23.069

(Continued)

FOREIGN PATENT DOCUMENTS

DE     102013114472 A1    6/2014

OTHER PUBLICATIONS

Ostmann, Andreas et al., "Industrial and Technical Aspects of Chip Embedding Technology", 2nd IEEE Electronics System-Integration Technology Conference, Greenwich, UK, Sep. 2008.

*Primary Examiner* — Allen L Parker
(74) *Attorney, Agent, or Firm* — Murphy, Bilak & Homiller, PLLC

(57) ABSTRACT

A power semiconductor device package includes a power semiconductor die having a first load terminal at a die frontside and a second load terminal at a die backside. The package has a package top side, a package footprint side, and a first terminal interface and a second terminal interface arranged at the package footprint side. The first terminal interface is electrically connected with the first load terminal. The die is disposed in a main cavity of an insulating core layer. A conductive material is provided at a cavity sidewall of the main cavity, and an insulation structure is provided in the main cavity. The insulation structure embeds the die, with the die backside facing the package top side. An electrical connection provided between the second load terminal and the second terminal interface is formed by at least the conductive material at the cavity sidewall.

25 Claims, 7 Drawing Sheets

(51) Int. Cl.
    *H01L 23/538*     (2006.01)
    *H01L 21/48*     (2006.01)
    *H01L 21/52*     (2006.01)
    *H01L 21/56*     (2006.01)
    *H01L 23/16*     (2006.01)

(52) U.S. Cl.
    CPC ............... *H01L 2224/04105* (2013.01); *H01L 2224/12105* (2013.01); *H01L 2224/18* (2013.01); *H01L 2224/2518* (2013.01); *H01L 2224/96* (2013.01)

(56) References Cited

U.S. PATENT DOCUMENTS

| | | | |
|---|---|---|---|
| 8,736,033 B1* | 5/2014 | Chuo | H01L 23/552 257/659 |
| 2002/0137263 A1 | 9/2002 | Towle et al. | |
| 2005/0124232 A1 | 6/2005 | Tabrizi | |
| 2012/0061833 A1* | 3/2012 | Jeong | H01L 23/5389 257/738 |
| 2016/0020194 A1* | 1/2016 | Gottwald | H05K 3/4608 257/774 |

\* cited by examiner

DIE EMBEDDING

TECHNICAL FIELD

This specification refers to embodiments of a method of embedding a power semiconductor die in a package and to embodiments of a power semiconductor device package that includes an embedded power semiconductor die.

BACKGROUND

Many functions of modern devices in automotive, consumer and industrial applications, such as converting electrical energy and driving an electric motor or an electric machine, rely on power semiconductor devices.

For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a power semiconductor die configured to conduct a load current along a load current path between two load terminals of the die. Further, the load current path may be controlled by means of an insulated electrode, sometimes referred to as gate electrode. For example, upon receiving a corresponding control signal from, e.g., a driver unit, the control electrode may set the power semiconductor device in one of a conducting state and a blocking state.

After the power semiconductor die has been manufactured, it has to be included in a package, e.g., in a manner that allows the die to be installed within an application, e.g., in a power converter, e.g., such that the die may be coupled to a printed circuit board (PCB).

For example, it is known that the die may be mounted on top of a core layer and to use bonding wires that provide for an electrical connection between the die load terminals and terminal interfaces of the package. Further, the die and the bonding wires may then be included within a housing of the package. This approach is also known as the "chip & wire" approach. For example, thereby, wire-bonded power dies on printed circuit boards (Direct Copper Bonded, DCB) may be provided.

As an alternative, the die may be mounted on a core layer by means of the so-called "flip-chip" technology, which may avoid use of bonding wires.

A yet further approach is to entirely embed the die within the core layer and to use one side (the so-called "footprint side") for providing electrical connections to both load terminals of the die, and to use the other side (the so-called "topside") primarily for heat dissipation. This approach is also known as the "chip embedding" approach.

Further, some principles of the die embedding approach are outlined by A. Ostmann et al. in "Industrial and technical aspects of die embedding technology", published at the $2^{nd}$ IEEE Electronics System-Integration Technology Conference, 1-4 Sep. 2008, DOI: 10.1109/ESTC.2008.4684368.

SUMMARY

Certain aspects of the present specification are related to the die embedding technology.

According to an embodiment, a method of embedding a power semiconductor die in a package is presented. The die comprises a first load terminal arranged at a die frontside and a second load terminal arranged at a die backside. The package has a package top side and a package footprint side, and comprises a first terminal interface and a second terminal interface, both arranged at the package footprint side, the first terminal interface being for electrical connection with the first load terminal. The method includes: providing an insulating core layer, the insulating core layer having a main cavity configured to house the die therein, wherein the main cavity has a cavity sidewall: providing a conductive material at the cavity sidewall; arranging the die in the main cavity, the die backside facing to the package top side, and providing an insulation structure in the main cavity, wherein the insulation structure embeds the die; and providing an electrical connection between the second load terminal and the second terminal interface by at least the conductive material provided at the cavity sidewall.

According to a further embodiment, a power semiconductor device package includes an embedded power semiconductor die, wherein the die comprises a first load terminal at a die frontside and a second load terminal at a die backside, and wherein the package has a package top side and a package footprint side. The package further comprises: a first terminal interface and a second terminal interface, both arranged at the package footprint side, the first terminal interface being electrically connected with the first load terminal; an insulating core layer having a main cavity, wherein the die is provided in the main cavity, and wherein the main cavity has a cavity sidewall; a conductive material at the cavity sidewall; an insulation structure in the main cavity, the insulation structure embedding the die, wherein the die backside is facing to the package top side; and an electrical connection the second load terminal and the second terminal interface, the electrical connection being formed by at least the conductive material at the cavity sidewall.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals may designate corresponding parts. In the drawings.

DETAILED DESCRIPTION

Figure 1A:
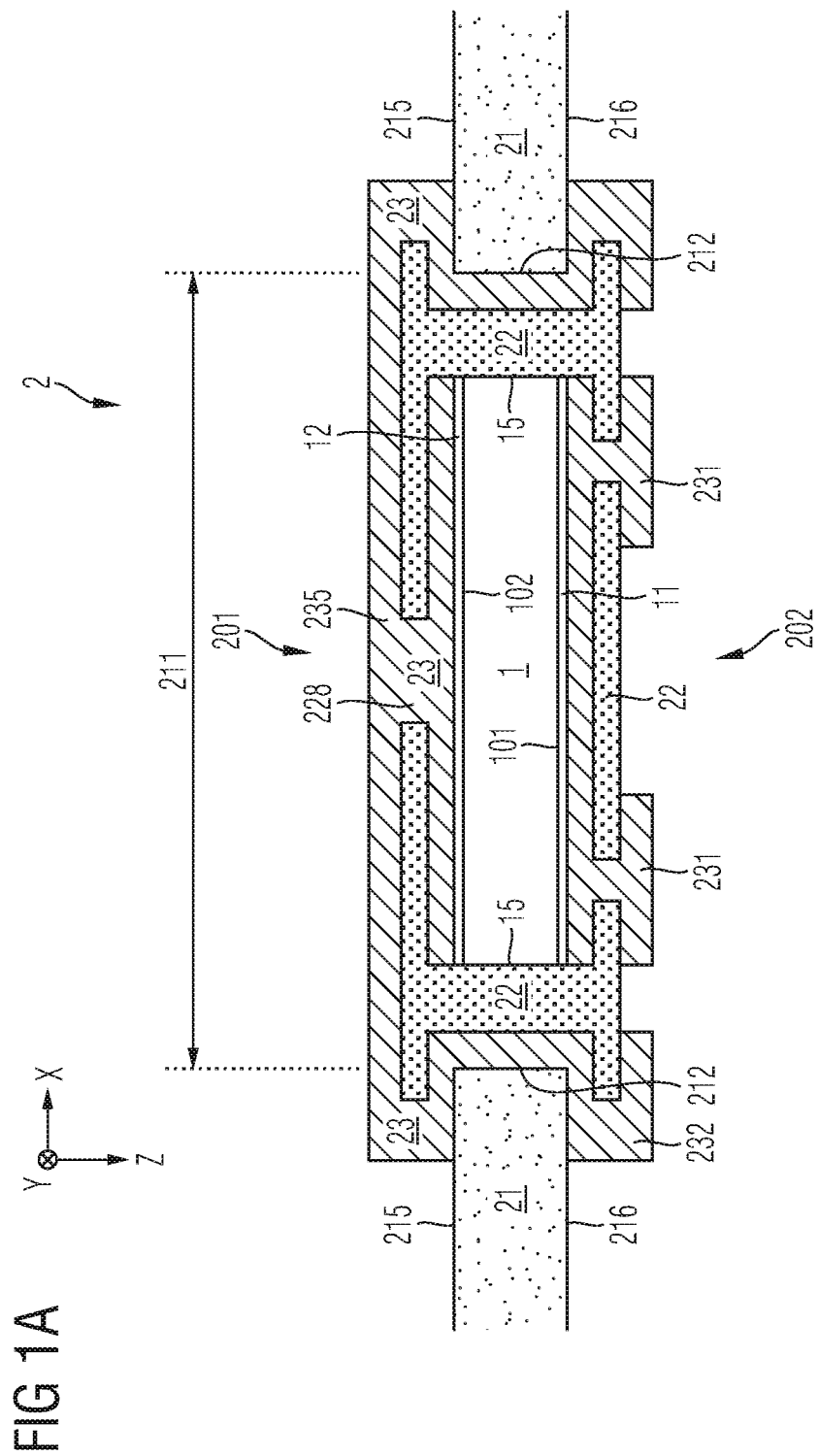
FIG. 1A-B each schematically and exemplarily illustrate a section of a vertical cross-section of a power semiconductor device package in accordance with some embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the (first) lateral direction X and the (second) lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of the device described herein. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor die, e.g., a power semiconductor die that may be used within a power converter or a power supply. Thus, in an embodiment, such die can be configured to carry a load current that is to be fed to a load and/or, respectively, that is provided by a power source. For example, the die may comprise one or more active power semiconductor cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. A plurality of such diode cells and/or such transistor cells may be integrated in the die.

The term "power semiconductor die" as used in this specification intends to describe a single die with high voltage blocking and/or high current-carrying capabilities. In other words, such power semiconductor die is intended for high current, typically in the Ampere range, e.g., up to 5 or 100 Amperes, and/or voltages typically above 15 V, more typically up to 40 V, and above, e.g., up to at least 500 V or more than 500 V, e.g. at least 600 V.

For example, the power semiconductor die described below may be a die that is configured to be employed as a power component in a low-, medium- and/or high voltage application. For example, the term "power semiconductor die" as used in this specification is not directed to logic semiconductor devices that are used for, e.g., storing data, computing data and/or other types of semiconductor based data processing.

Before being able to be employed within an application, the power semiconductor die is usually included within a package that may allow mechanically mounting and electrically connecting the die within the application, e.g., also for heat distribution purposes. As has been introductorily mentioned, this may include embedding the die in a package.

Figure 7:
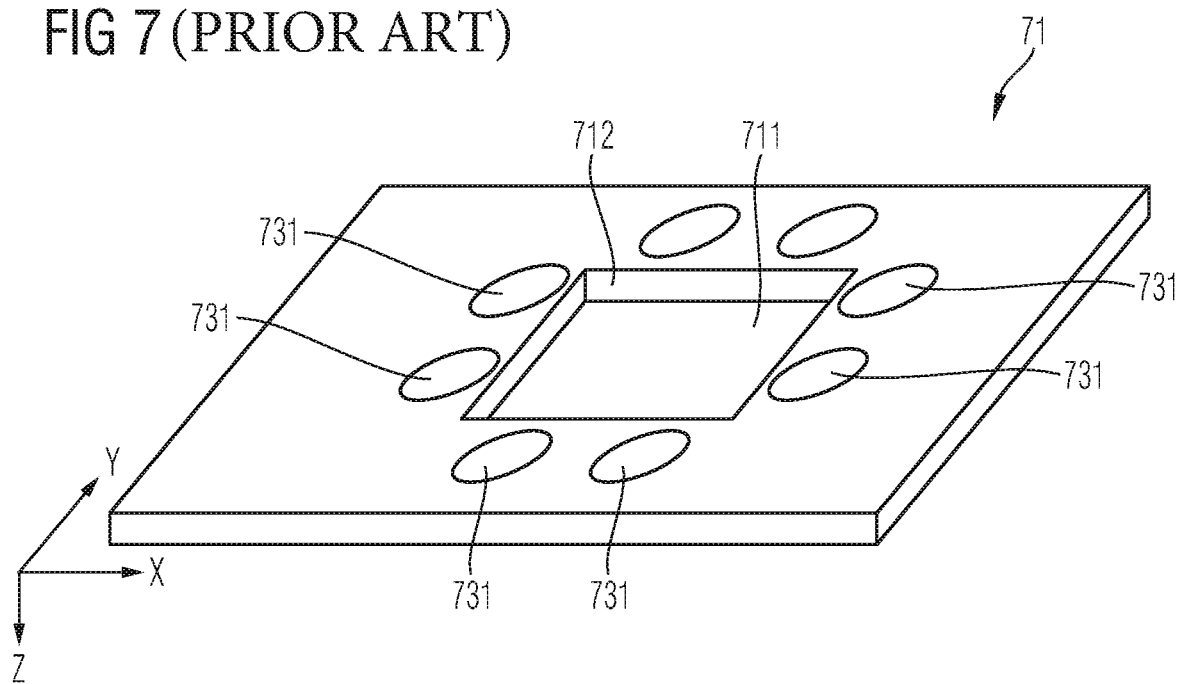
FIGS. 7-8 each schematically and exemplarily illustrate aspects of a known power semiconductor device package.
Figure 8:
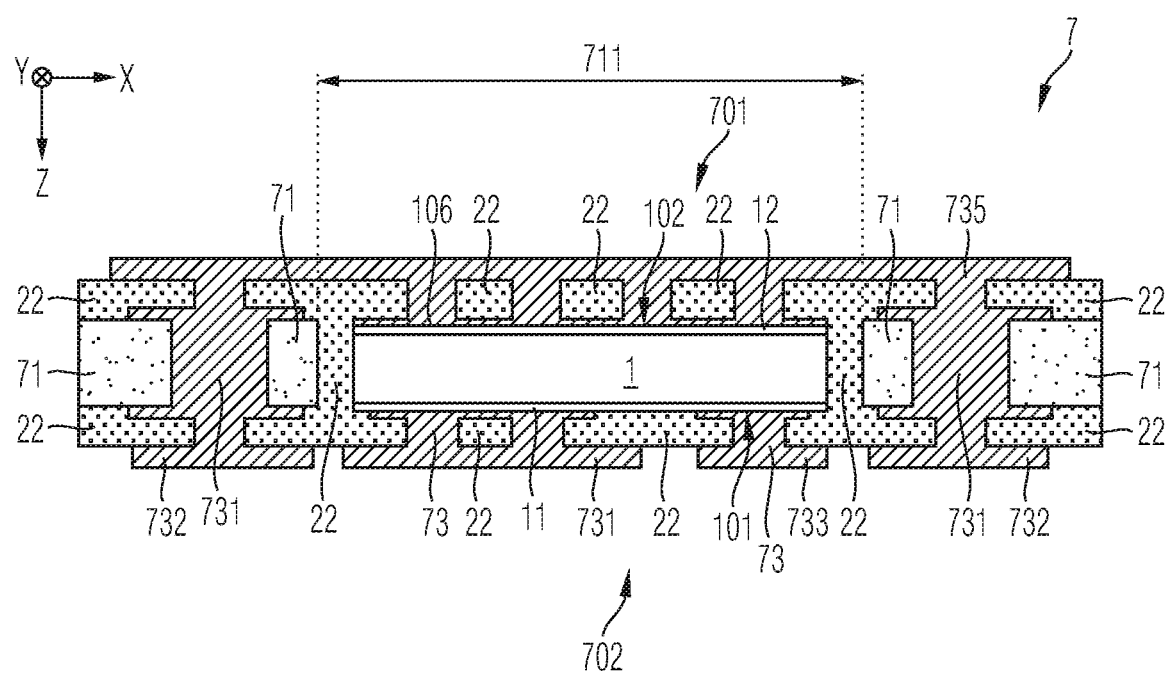

Regarding FIGS. 7-8, which each schematically and exemplarily illustrate aspects of a known power semiconductor device package, a way of embedding a power semiconductor die 1 (herein also simply referred to as die 1) in a package 7 shall be explained. For example, a core layer 71 may be provided, wherein such core layer can be a layer of a printed circuit board, for example. The core layer 71 may have a main cavity 711 that may have a cavity sidewall 712. For example, the cavity sidewall 712 spatially confines the main cavity 711. The main cavity 711 may be dimensioned so as to fit the die 1 therein. The die 1 may have two load terminals 11 and 12 arranged on opposite sides of the die 1. For example, a first load terminal 11 is arranged on the die frontside 101, and a second load terminal 12 is arranged on a die backside 102. The die 1 may be configured to conduct a load current between these load terminals 11, 12.

It may be desirable to have the package 7 gather some terminal connections on a package footprint side 702 and use an opposite package top side 701 for another purpose, e.g., for dissipating heat generated during operation of the power semiconductor die 1. For example, the core layer 71 may be provided with a number of through holes 731 arranged separately from the main cavity 711, i.e., positioned in distance to the cavity sidewall 712. For example, through holes 731 may be manufactured by drilling or laser cutting.

During the packaging processing method, such through holes 731 may be filled with a conductive material 73 so as to establish an electrically conductive path between the second load terminal 12 arranged on the die backside 102 and the package footprint side 702. The holes 731 may also be referred to as "plated through holes" (PTH), as filling the holes with the conductive material 73 may involve an electroplating processing step.

Regarding FIG. 8, an insulation structure 22 may be employed in order to embed the power semiconductor die 1 within the cavity 711. For example, the insulation structure 22 may provide for a mechanical support (e.g. fixture) for the die 1 and allow the conductive material 73 to extend in the illustrated manner, e.g., so as to form each of the conductive top side layer 735 at the package top side 701 and terminal interfaces 731, 732 and 733 at the package footprint side 702 that allow for electrical connection with the terminals of the power semiconductor die 1.

In accordance with one or more embodiments described herein, a technology of die embedding is presented that may allow for avoiding the through holes 731 in the core layer and for providing terminal interfaces on the package footprint side, e.g., by gathering all terminal interfaces on the package footprint side, while using the package top side for another purpose, e.g., for cooling the embedded die.

In the following, a new package having a die embedded therein and a method for embedding the die to form the package are provided. According to the new concept, for example, a sidewall of a main cavity for receiving the die in an insulating core layer provides for an electrical connection between an upper surface of the (embedded) die and a lower surface of the package.

Figure 1B:
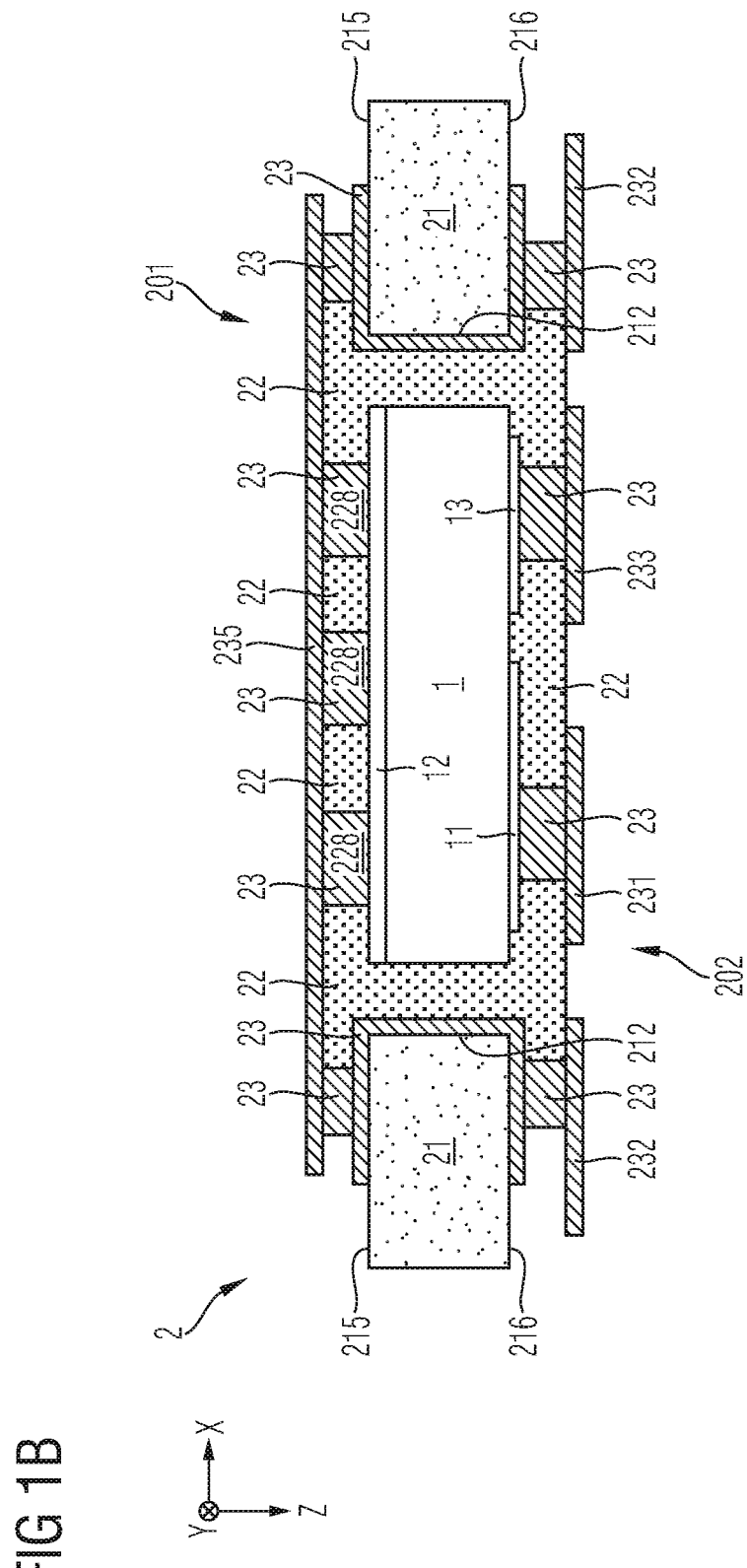

FIGS. 1A and 1B each schematically and exemplarily illustrate a section of a vertical cross-section of a power semiconductor device package 2 (herein also simply referred to as package 2) in accordance with one or more embodiments. In the following, it will be referred to each of FIGS. 1A and 1B.

The power semiconductor device package 2 includes an embedded power semiconductor die 1, wherein the die 1 comprises a first load terminal 11 arranged at a die frontside 101 and a second load terminal 12 arranged at a die backside 102. The die 1 may thus exhibit a vertical configuration, according to which the two load terminals 11 and 12 are arranged on opposite sides of the die 1.

In lateral directions, e.g., in the lateral directions X and Y and linear combinations thereof, the die 1 may be terminated by a die edge 15 that extends in vertical direction Z.

For example, the die 1 may be configured to conduct a load current between terminals 11 and 12, e.g., load current greater than 5 A, greater than 10 A, or a load current of more than 100 A. The maximum load current that can continuously be conducted by the die is indicated by a load current rating of the die, for example.

In an embodiment, the die 1 may be configured to block a voltage applied between terminals 11 and 12, e.g., a voltage greater than 30 V, greater than 50 V, or a blocking voltage of more than 500 V.

In an embodiment, the die 1 can be one of power diode, in which case the first load terminal 11 can be anode port and the second load terminal 12 can be cathode port, a power IGBT, in which case the first load terminal 11 can be an emitter terminal and the second load terminal 12 can be collector terminal, a MOSFET, in which case the first load terminal 11 can be a source terminal and the second load terminal 12 can be drain terminal, or a power device derived from one or more of these basic configurations, e.g., a JFET (Junction Field Effect Transistor), sometimes referred to as SFET (German: Sperrschicht Feld Effekt Transistor).

For example, the second load terminal 12 arranged at the die backside 102 can be formed by means of a backside metallization. In an embodiment, the die 1 includes only the second load terminal 12 at the die backside 102 and no other terminal is arranged on the die backside 102. Further, on the die frontside 101 where the first load terminal 11 is arranged, there may additionally be arranged a control terminal (cf. reference numeral 13 in FIG. 1B and FIG. 3, for example), e.g., a gate terminal in case the die 1 is implemented controllable device, such as an MGD or a transistor, e.g., MOSFET or an IGBT. For example, the control terminal (cf, reference numeral 13 in FIG. 3, for example) may be electrically insulated from the first load terminal 11.

The package 2 has a package top side 201 and a package footprint side 202. In an embodiment, the package top side 701 is used for dissipating heat produced during operation of the power semiconductor die 1 (power losses), wherein, at the package footprint side 702, terminal interfaces may be provided that allow for electrical connection with the terminals 11, 12 of the power semiconductor die 1, e.g., by gathering all terminal interfaces at the package footprint side 702 and none at the package top side 701.

In an embodiment, the package 2 comprises a first terminal interface 231 for electrical connection with the first load terminal 11 and a second terminal interface 232, wherein the first terminal interface 231 and the second terminal interface 232 are arranged at the package footprint side 202. It will become apparent from the subsequent explanation that the second terminal interface 232 may be used for an electrical connection with the second load terminal 12 that is arranged at the die backside 102.

The package 2 may further comprise an insulating core layer 21 (herein also simply referred to as core layer 21). The core layer 21 may be arranged between the package top side 201 and package footprint side 202. The core layer 21 may form a component of a printed circuit board. The core layer 21 may be made of an electrically insulating material, e.g., made of a polymer, a PCB laminate, a flame retardant (FR) material (e.g., FR4), a composite epoxy material (CEM), such as CEM1 or CEM3, a Bismaleimide-Triazine resin (BT) material, imide, polyimide, ABF, or made of a combination of the aforementioned exemplary materials.

For example, the core layer 21 is a monolithic core layer. The core layer 21 may exhibit a thickness in Z direction that is within the range of 20 to 800 μm, within the range of 40 to 300, or within the range of 60 to 140. In an embodiment, a thickness of the die 1 and the thickness of the core layer 21 may be identical or, respectively, at least substantially identical to each other.

The core layer 21 can have a main cavity 211 that may receive (e.g. house) the die 1 therein. The main cavity 211 has a cavity sidewall 212. For example, the cavity sidewall 212 spatially confines the main cavity 211. In an embodiment, for example in a cross-section as shown in FIG. 1A, the cavity sidewall 212 may be parallel to the die edge 15. In an embodiment, the core layer 21 and the die 1 are substantially co-planar to each other in the package, for example, with respect to an upper surface 215 and/or a lower surface 216.

In an embodiment, a conductive material 23 is provided at the cavity sidewall 212. For example, the conductive material 23 is provided on the cavity sidewall 212, e.g., so as to cover the cavity sidewall 212 at least partially. In an embodiment, the conductive material 23 is arranged so as to entirely cover the cavity sidewall 212 at least in a vertical cross-section as illustrated in FIG. 1A. Further, also parts of the upper surface 215 and/or the lower surface 216 of the core layer 21 and/or edges between the cavity sidewall 212 and at least one of surfaces 215 and 216 may be covered with the conductive material 23, in accordance with an embodiment.

The conductive material 23 may comprise at least one of copper, nickel, silver, gold, tin or a combination of these materials. For example, the conductive material 23 exhibits a conductivity greater than $10^6 * 1/\Omega m$. A thickness along the first lateral direction X of the conductive material 23 at the cavity sidewall 212 may be chosen in dependence of the load current rating of the die 1, in accordance with an embodiment. For example, the conductive material 23 may be dimensioned such that it is configured to carry at least the load current for which the die 1 has been rated.

Thus, in an embodiment, the semiconductor die 1 can be configured to conduct a load current between the first load terminal 11 and the second load terminal 12, wherein the package 2 may be configured to conduct the load current along the cavity sidewall 212 via the provided conductive material 23. For example, the conductive material 23 is provided at the sidewall 212 in such a manner that it is also configured for conducting a load current in accordance with the load current rating of the die 1.

The package 2 may further comprise an insulation structure 22 that may be included in the main cavity 211. The insulation structure 22 can be different from the core layer 21, e.g., the insulation structure 22 and the core layer 21 may be separate components/elements of the package 2, which can be made of different materials, for example. Further, the insulation structure 22 can embed the die 1, e.g., within the main cavity 212, as schematically and exemplarily illustrated in FIG. 1. In an embodiment, the conductive material 23 at the cavity sidewall 212 and the die edge 15 are electrically insulated from each other by means of the insulation structure 22. For example, on one side, the insulation structure 22 interfaces with the die edge 15, and, on the other side, the insulation structure 22 interfaces with (e.g., contacts) the conductive material 23. In other words, the conductive material 23 arranged at the cavity sidewall 212 may (e.g. mechanically) couple the core layer 21 to the insulation structure 22.

Accordingly, for example, the die 1 is embedded within the main cavity 211 by means of the insulation structure 22. For example, the insulation structure 22 may partially or entirely surround the die edge 15. Additionally or alternatively, the insulation structure 22 may partially or entirely cover the die edge 15.

The die 1 can be arranged such that the die backside 102 is facing to the package top side 201. Further, the die frontside 101 can be facing to the package footprint side 202. Moreover, the die backside 102 to may be arranged in parallel to the upper surface 215 of the core layer 21, and the die frontside 101 may be arranged in parallel to the lower surface 216 of the core layer 21. In an embodiment, the die frontside 101 and the die backside 102 are parallel to each other, and the package top side 201 and package footprint side 202 may be parallel to each other, too.

In an embodiment, the package 2 further comprises an electrical connection between the second load terminal 12 and the second terminal interface 232. This electrical connection is formed by at least the conductive material 23 at the cavity sidewall 212. For example, for providing the electrical connection between the second terminal interface 232 that is arranged at the package footprint side 22 and the second load terminal facing to the package top side 201, through holes in the core layer may not be needed, since an electrical path along the vertical direction may be formed by means of the conductive material 23 arranged at the cavity sidewall 212.

In an embodiment, the package 2 may further include an electrically conductive top side layer 235 at the package top side 201, wherein the insulation structure 22 may have at least one top side passage 228, and wherein the at least one top side passage 228 can be filled with a conductive material, e.g., with the same conductive material 23 that is provided at the cavity sidewall 212, thereby providing an electrical connection between the second load terminal 12 and the conductive top side layer 235.

For example, the electrical connection between the second terminal interface 232 and the second load terminal 12 is further established by means of the top side layer 235. The conductive top side layer 235 may laterally extend, for example so as to join with the conductive material 23 provided at the cavity sidewall 212. The conductive top side layer 235 may be made of the same material 23 that is provided at the cavity sidewall 212.

In an embodiment, the package 2 that may house the die 1 does not include any wires, such as bonding wires or the like. Thus, for example, the electrical connections between the terminal interfaces 231, 232 and the load terminals 11, 12, respectively, may be realized (only) by means of the conductive material 23. Exemplary ways of providing such conductive material 23 will be explained further below.

Figure 2:
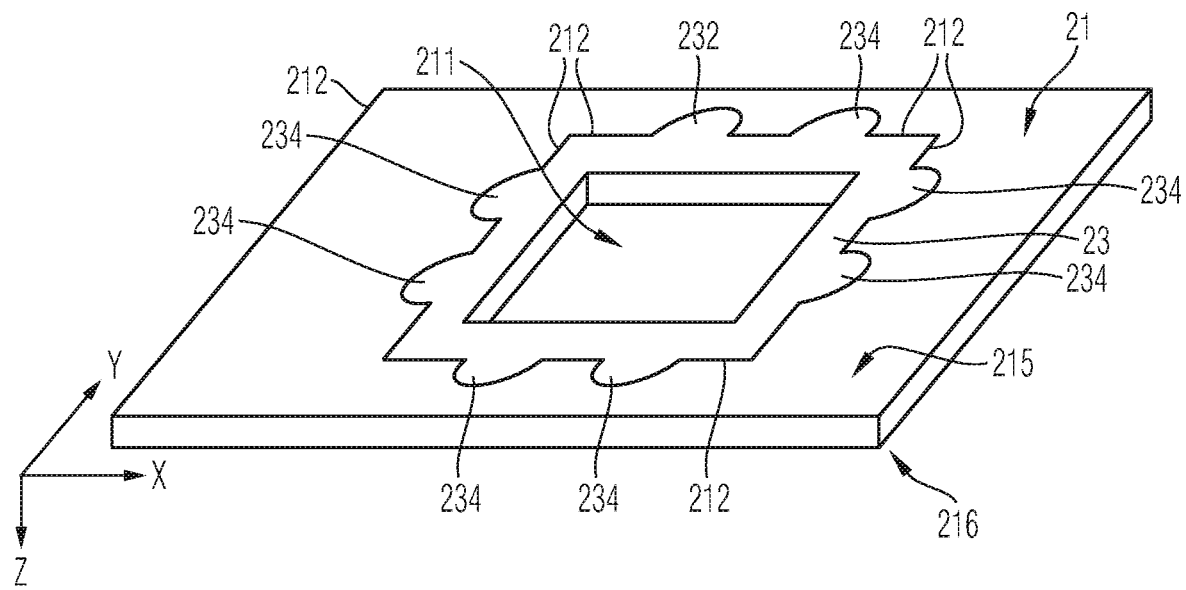
FIG. 2 schematically and exemplarily illustrates a section of a perspective view on a core layer of a power semiconductor device package in accordance with one or more embodiments.
Figure 3:
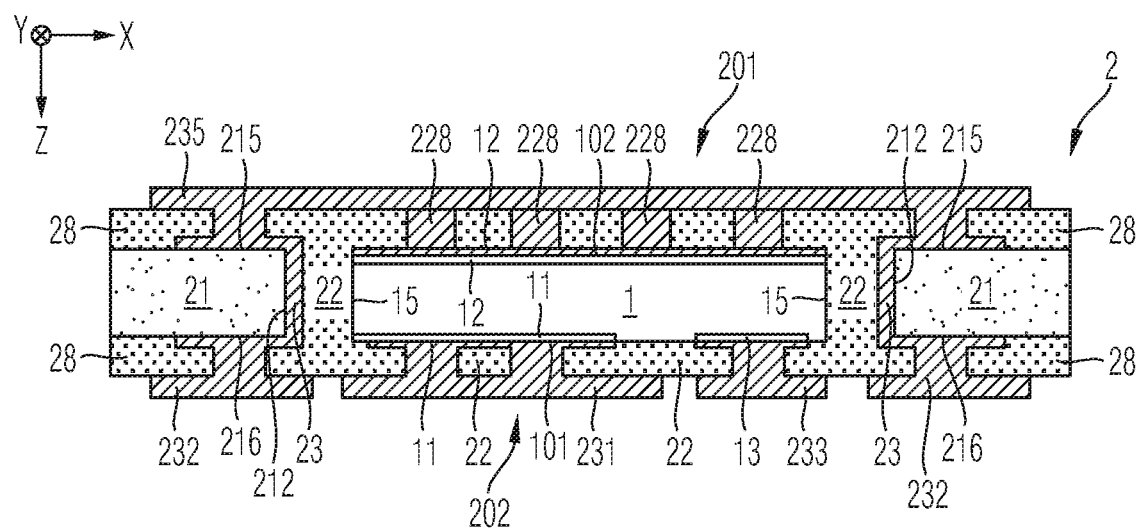
FIG. 3 schematically and exemplarily illustrates a section of a vertical cross-section of a power semiconductor device package in accordance with one or more embodiments.
Figure 4:
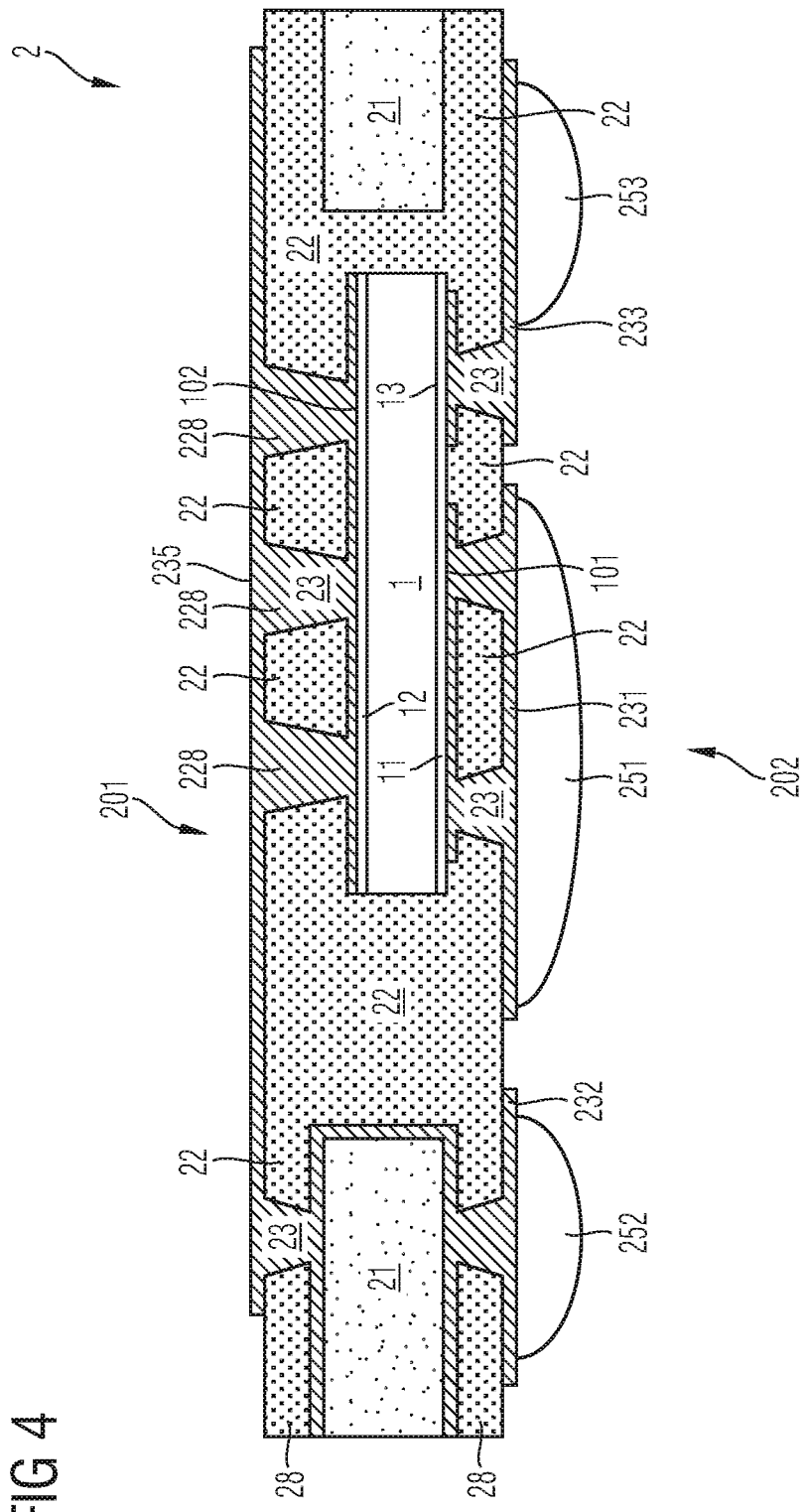
FIG. 4 schematically and exemplarily illustrates a section of a vertical cross-section of a power semiconductor device package in accordance with one or more embodiments.

Further optional aspects of the power semiconductor device package 2 shall be explained with respect to FIGS. 2 to 4, wherein FIG. 2 schematically and exemplarily illustrates a section of a perspective view on an embodiment of the core layer 21, and wherein each of FIG. 3 and FIG. 4 illustrate a section of a vertical cross-section of a respective embodiment of the power semiconductor device package 2.

For example, as illustrated in FIG. 2, the entire cavity sidewall 212 may be covered with the conductive material 23, and/or portions of the upper surface 215 and the lower surface 216 (not visible in FIG. 2) of the core layer 21 may be covered with the conductive material 23. Further, the conductive material 23 may be arranged so as to provide for one or more landing areas 234 which may be used for realizing further electrical paths within the package 2, e.g., for realizing so-called micro-vias (also referred to as "μvias") within the package 2. For example, each of the one or more landing areas 234 may be formed at least by a clearly detectable locally increased surface area of the conductive material 23, as exemplarily illustrated.

Referring to FIG. 3, the package may include a third terminal interface 233 arranged at the package footprint side 202, wherein the die 1 may further comprise a control terminal 13 (as has already been indicated above with respect to FIG. 1B) arranged at the die frontside 101 and electrically connected to the third terminal interface 233. Further, each of the first terminal interface 231, the second terminal interface 232 and the third terminal interface 233 can be electrically insulated from each other.

In an embodiment, the insulation structure 22 may comprise more than one top side passage 228, e.g., two, three, four, or more top side passages 228, and the conductive material 23 may extend into each of the top side passages 228 and also (laterally) below the top side passages 228, e.g., so as to interface with the second load terminal 12, and also above the top side passages 228, e.g., so as to form the conductive top side layer 235.

The aforementioned aspects regarding the third terminal interface 233 and the plurality of top side passages 228 are also schematically illustrated in FIG. 4. The package 2 may additionally comprise a pad structure arranged at the package footprint side 202 and comprising a first pad 251 that may be electrically connected to the first terminal interface 231, a second pad 252 that may be electrically connected to the second terminal interface 232 and optionally (e.g., if the power semiconductor die 1 comprises a control terminal 13, as exemplarily illustrated) a third pad 253 that may be electrically connected with the third terminal interface 233. For example, the first pad 251 may constitute a source pad, the second pad 252 may constitute a drain pad and the third pad 253 may constitute a gate pad. In an embodiment of the package 2, these pads 251 to 253 are not further packaged, but provide a contact area that may be contacted by means external to the package 2, for example, by means not part of the package 2.

It shall be understood that in other embodiments not illustrated herein, the power semiconductor die 1 may include more than one terminal at its backside 102 or, respectively, could be arranged in an opposite manner within the package 2 such that its frontside 101 including (in an example) the first load terminal 11 and the control terminal 13 facing to the package top side. Then, different sections of the cavity sidewall 212 may be used in order to implement the electrical connection along the vertical direction Z so as to provide for separate electrical connections between the two or more die terminals at the die side that faces to the package top side 201 with corresponding terminal interfaces arranged at the package footprint side 202.

Regarding exemplary dimensions, the die 1 may have a total lateral extension along the first lateral direction X of one or more mm, e.g., 2 mm, and a total lateral extension along the second lateral direction Y of also one or more mm, e.g., 2 mm, the main cavity 211 may be dimensioned slightly larger so as to be able to fit each of the insulation structure 22 and the die 1 therein. As has been indicated above, the thickness of the die 1 may be in the range some μm, e.g., around 100 μm, in an example.

Further, it shall be understood that the core layer 21 can comprise more than one main cavity 211 and may correspondingly accommodate more than one die 1. However, in an embodiment, in each main cavity 211, there is included no more than one die 1.

As, at least in one or more embodiments, the use of through holes may be avoided due to providing the conductive material 23 at the cavity sidewall 211, the total lateral dimensions of the package 2 may be reduced or, respectively, a core layer 21 with given dimensions may accommodate more and/or one or more larger dies as compared to the variant that employs the through holes (cf. reference numeral 731 in FIG. 7). In the outcome, this may allow for increasing the power density of the entire package 2.

Figure 5:
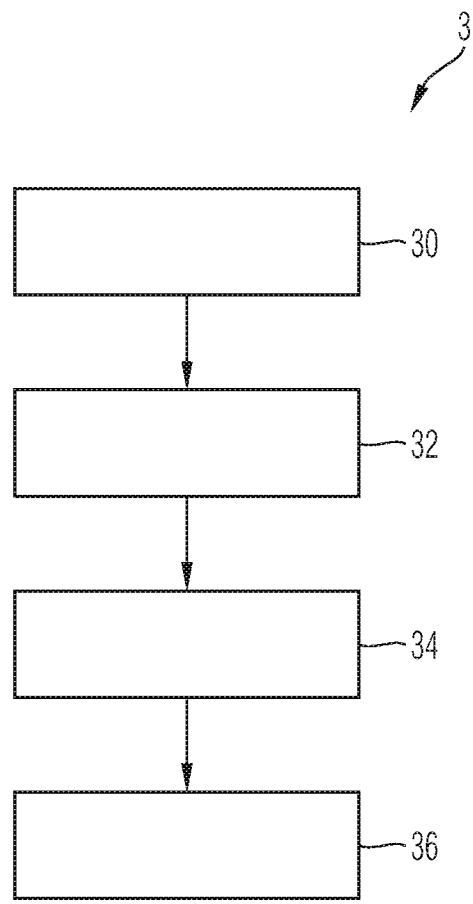
FIGS. 5-6 each schematically and exemplarily illustrate steps of a method of embedding a power semiconductor die in a package in accordance with some embodiments.
Figure 6:
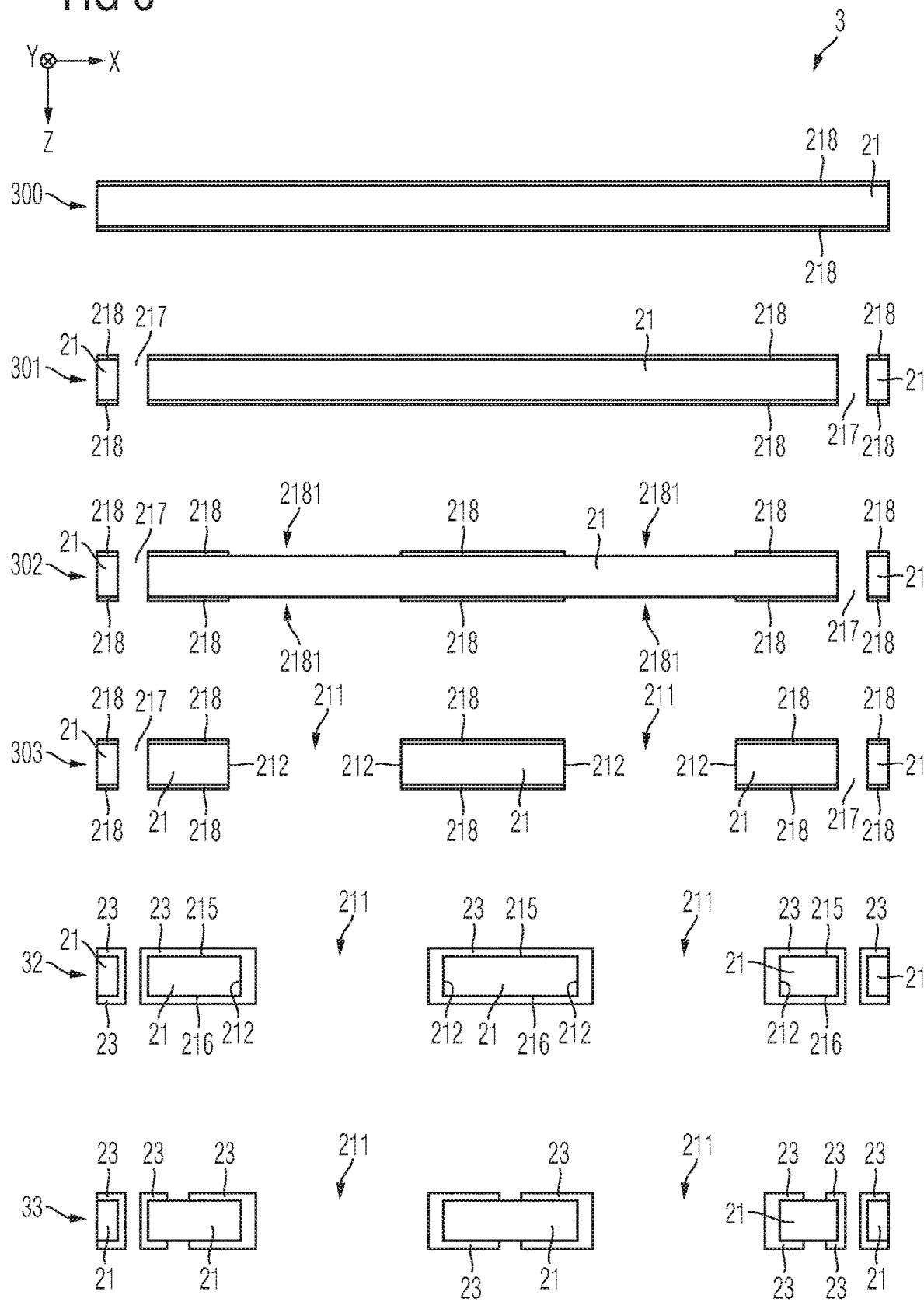

FIGS. 5-6 each schematically and exemplarily illustrate steps of a method 3 of embedding a power semiconductor die in a package in accordance with some embodiments. For example, the method 3 described below may be employed to produce one or more embodiments of the package 2 described above. Thus, it shall be understood that exemplary aspects of the package 2 described above may analogously apply to the method 3 described hereinafter and vice versa.

Method 3 may include, in a step 30, providing the insulating core layer 21, the insulating core layer 21 having the main cavity 211 configured to house the die 1 therein, wherein the main cavity 211 has the cavity sidewall 212.

Step 30 may include steps 300 to 303 illustrated in FIG. 6. For example, the provided core layer 21 (step 300) is covered with a metal (e.g. copper) layer 218. In step 301, holes 217 may be provided, e.g. drilled, for example to provide jig holes, which may be used during subsequent processing steps, e.g., for alignment purposes. Further, in step 301, an alignment marking may be carried out. In step 302, the metal layer 218 may be partially removed, e.g., in a section where the main cavities shall be provided. This partial removal of the metal layer 218 may expose surface sections 2181 of the core layer 21. Such removal may be carried out by standard lithography and etching processing steps. In these sections 2181, the core layer 21 can be subjected to the further removal step 303, in which the main cavities 211 are formed, e.g., by means of laser cutting. Instead of laser cutting, also a mechanical routing could be carried out in order to form the main cavities 211.

Subsequent to forming the main cavities 211, in step 32, the conductive material 23 may be provided at the cavity sidewall 212 of the main cavities 211. The conductive material may be provided with a thickness of at least 5 μm, wherein the chosen thickness may depend on the load current capability of the die 1, as has been explained above. For example, the entire sidewalls 212 are covered, e.g., at least within a vertical cross-section of the package 2 as illustrated in FIG. 3, as well as optionally at least portions of the upper surface 215 and the lower surface 216 of the core layer 21. Providing the conductive material 23 may be carried out, in an example, by means of an electroplating processing step, e.g., a copper plating processing step.

Thereafter, in step 33, the provided conductive material 23 may be structured, e.g., in the manner so as to ensure that adjacent main cavities 211 can have electrical paths electrically insulated from each other. For example, a sidewall 212 that spatially confines one of the main cavities 211 is covered with a section of the conductive material 23 that is electrically insulated from another section of the conductive material 23 that is provided at another sidewall 212 that spatially confines another one of the main cavities 211, as schematically illustrated in FIG. 6. In an embodiment, such structuring of the provided conductive material 23 may be carried out by means of standard lithography and etching processing steps. In another embodiment, such structuring of the provided conductive material 23 may be carried out by means of mechanical processing steps, e.g. by cutting.

Reverting to FIG. 5, in step 34, the die 1 may be provided, e.g. arranged, in the main cavity 211, wherein the die backside 102 may face to the package top side 201, in an embodiment. Further, the insulation structure 22 may be provided, e.g. arranged, in the main cavity 211, wherein the insulation structure 22 embeds the die 1. These two providing steps must not necessarily be carried out simultaneously. For example, in one embodiment, the insulation structure 22 and the die 1 are provided in the main cavity 211 simultaneously, and in another embodiment, parts of the insulation structure 22 are provided within the main cavity 211 first, thereafter the die 1 and thereafter remaining parts of the insulation structure 22 are provided in the main cavity 211. The insulation structure 22 may ensure an electrical insulation between the conductive material 23 provided at the cavity sidewall 212 and die edge 15.

In step 36, the electrical connection between the second load terminal 12 and the second terminal interface 232 may be established via at least the conductive material 23 provided at the cavity sidewall 212. For example, this may include forming the conductive top side layer 235 mentioned above with respect to the exemplary embodiments of the package 2.

In an embodiment, method 3 forms a part of a Printed Circuit Board (PCB) manufacturing process. Thus, in accordance with one or more embodiments described herein, a method of producing a PCB and a method of including the power semiconductor die in a package are combined/united into a single process.

For example, method 3 further comprises, e.g., after providing (in step 32) the conductive material 23 at the cavity sidewall 212 and as part of providing (in step 34) the die 1 in the main cavity 211: laminating a tape to the lower surface 216 of the core layer 21, thereby at least partially covering a lower opening of the main cavity 211, e.g., so as to provide a temporary die support. Then, i.e., thereafter, the die 1 can be provided at the tape, e.g., by arranging, e.g., bonding, the die 1 on the tape. For example, the tape may thereafter be removed from the core layer 21 after the insulation structure 22 is provided in the main cavity 211.

In accordance with one or more embodiments described herein, the power semiconductor die 1 is provided as a bare die, i.e., as an unpackaged die, and is as such embedded inside the main cavity 211 of the core layer 21, i.e., instead of being mounted on top of the upper surface 215 or the lower surface 216 of the core layer 21. In other words, the package 2 may be manufactured "around" the die 1 instead of mounting the die on a pre-manufactured package. For example, the package may be manufactured "around" the die 1 by providing the die 1 into the main cavity 211 and thereafter providing the parts of the insulation structure 22 at at least one side surface of the die to embed the die in the package. In doing so, the die may not be mounted on/into a pre-manufactured package. As has been indicated above, in accordance with one or more embodiments, a package manufacturing method, e.g., a PCB manufacturing method, and a method of including a power semiconductor die 1 within the package are combined into a single process.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of embedding a power semiconductor die in a package, the power semiconductor die comprising a first load terminal arranged at a die frontside and a second load terminal arranged at a die backside, and the package having a package top side and a package footprint side, and comprising a first terminal interface and a second terminal interface, both arranged at the package footprint side, the first terminal interface being for electrical connection with the first load terminal, the method comprising:
    providing an insulating core layer having a main cavity configured to house the power semiconductor die, the main cavity having a cavity sidewall;
    providing a conductive material at the cavity sidewall;
    arranging the power semiconductor die in the main cavity, wherein the die backside faces the package top side;
    providing an insulation structure in the main cavity and that embeds the power semiconductor die; and
    providing an electrical connection between the second load terminal and the second terminal interface by at least the conductive material provided at the cavity sidewall.

2. The method of claim 1, wherein providing the conductive material at the cavity sidewall comprises carrying out an electroplating processing step.

3. The method of claim 1, wherein the conductive material comprises at least one of copper, nickel, silver, gold, and tin.

4. The method of claim 1, wherein the conductive material covers the entire cavity sidewall.

5. The method of claim 1, further comprising structuring the conductive material.

6. The method of claim 1, wherein the conductive material has a thickness of at least 5 μm.

7. The method of claim 1, wherein the power semiconductor die is configured to conduct a load current between the first load terminal and the second load terminal, and wherein the package is configured to conduct the load current along the cavity sidewall via the provided conductive material.

8. The method of claim 1, wherein the insulation structure provides electrical insulation between the conductive material at the cavity sidewall and an edge of the power semiconductor die.

9. The method of claim 1, wherein the method is part of a printed circuit board manufacturing process.

10. The method of claim 1, wherein providing the power semiconductor die in the main cavity comprises:
    laminating a tape to a lower surface of the insulating core layer to at least partially cover a lower opening of the main cavity; and
    providing the power semiconductor die at the tape.

11. The method of claim 10, further comprising removing the tape from the insulating core layer after the insulation structure is provided in the main cavity.

12. The method of claim 1, wherein the power semiconductor die is a power transistor die, wherein the first load terminal at the die frontside is an emitter or source terminal, wherein the second load terminal at the die backside is a collector or drain terminal, and wherein the electrical connection formed by at least the conductive material at the cavity sidewall is between the collector or drain terminal at the die backside and the second terminal interface at the package footprint side.

13. The method of claim 1, wherein the power semiconductor die is a power diode die, wherein the first load terminal at the die frontside is an anode port, wherein the second load terminal at the die backside is a cathode port, and wherein the electrical connection formed by at least the conductive material at the cavity sidewall is between the cathode port at the die backside and the second terminal interface at the package footprint side.

14. A power semiconductor device package, comprising:
    a package top side;
    a package footprint side;

a power semiconductor die having a first load terminal at a die frontside and a second load terminal at a die backside;

a first terminal interface and a second terminal interface arranged at the package footprint side, the first terminal interface being electrically connected with the first load terminal;

an insulating core layer having a main cavity, wherein the power semiconductor die is provided in the main cavity, and wherein the main cavity has a cavity sidewall;

a conductive material at the cavity sidewall;

an insulation structure in the main cavity and embedding the power semiconductor die, wherein the die backside faces the package top side; and an electrical connection between the second load terminal and the second terminal interface, the electrical connection being formed by at least the conductive material at the cavity sidewall.

15. The power semiconductor device package of claim 14, wherein the insulating core layer is a monolithic core layer.

16. The power semiconductor device package of claim 14, wherein the insulation structure is different from the core layer.

17. The power semiconductor device package of claim 14, wherein the conductive material at the cavity sidewall and an edge of the power semiconductor die are electrically insulated from each other by the insulation structure.

18. The power semiconductor device package of claim 14, wherein the insulation structure surrounds an edge of the power semiconductor die.

19. The power semiconductor device package of claim 14, further comprising an electrically conductive top side layer at the package top side, wherein the insulation structure has at least one top side passage, and wherein the at least one top side passage is filled with a conductive material to provide an electrical connection between the second load terminal and the electrically conductive top side layer.

20. The power semiconductor device package of claim 19, wherein the electrically conductive top side layer also provides the electrical connection between the second load terminal and the second terminal interface.

21. The power semiconductor device package of claim 14, wherein the power semiconductor die is configured to conduct a load current between the first load terminal and the second load terminal, and wherein the power semiconductor device package is configured to conduct the load current along the cavity sidewall via the conductive material.

22. The power semiconductor device package of claim 14, wherein the second load terminal is formed by a backside metallization of the power semiconductor die.

23. The power semiconductor device package of claim 14, further comprising a third terminal interface arranged at the package footprint side, wherein the power semiconductor die further comprises a control terminal arranged at the die frontside and electrically connected to the third terminal interface, and wherein each of the first terminal interface, the second terminal interface and the third terminal interface are electrically insulated from each other.

24. The power semiconductor device package of claim 14, wherein the power semiconductor die is a power transistor die, wherein the first load terminal at the die frontside is an emitter or source terminal, wherein the second load terminal at the die backside is a collector or drain terminal, and wherein the electrical connection formed by at least the conductive material at the cavity sidewall is between the collector or drain terminal at the die backside and the second terminal interface at the package footprint side.

25. The power semiconductor device package of claim 14, wherein the power semiconductor die is a power diode die, wherein the first load terminal at the die frontside is an anode port, wherein the second load terminal at the die backside is a cathode port, and wherein the electrical connection formed by at least the conductive material at the cavity sidewall is between the cathode port at the die backside and the second terminal interface at the package footprint side.

* * * * *